United States Patent [19]

Yatsuo et al.

[11] Patent Number: 4,542,398
[45] Date of Patent: Sep. 17, 1985

[54] SEMICONDUCTOR DEVICES OF MULTI-EMITTER TYPE

[75] Inventors: Tsutomu Yatsuo, Hitachi; Masayoshi Naito, Katsuta; Takahiro Nagano, Hitachi; Tomio Yasuda, Hitachi; Jin Onuki, Hitachi; Mitsuo Yanagi, Hitachi; Fumio Sato, Hitachi, all of Japan

[73] Assignee: Hitachi, Ltd., Tokyo, Japan

[21] Appl. No.: 621,370

[22] Filed: Jun. 18, 1984

Related U.S. Application Data

[63] Continuation of Ser. No. 295,249, Aug. 24, 1981, abandoned.

[30] Foreign Application Priority Data

Sep. 1, 1980 [JP] Japan .................................. 55-119810

[51] Int. Cl.⁴ ............................................. H01L 29/74
[52] U.S. Cl. ........................................ 357/38; 357/68; 357/56
[58] Field of Search ...................... 357/38, 39, 68, 56

[56] References Cited

U.S. PATENT DOCUMENTS

| 4,079,409 | 3/1978 | Rathmann | 357/38 X |
| 4,155,155 | 5/1979 | Bourdon | 357/38 X |
| 4,352,118 | 9/1982 | Temple | 357/38 |
| 4,403,242 | 9/1983 | Tsuruoka | 357/68 |
| 4,404,580 | 9/1983 | Konishi | 357/38 |

FOREIGN PATENT DOCUMENTS

136185 10/1979 Japan .................................... 357/38

Primary Examiner—Martin H. Edlow
Attorney, Agent, or Firm—Antonelli, Terry & Wands

[57] ABSTRACT

A multi-emitter type semiconductor device, namely, a semiconductor device having an arrangement in which a majority of emitter regions are divided by a gate region and surrounded thereby. In the semiconductor device, a member adapted to apply an external control signal to a gate electrode takes the form of a closed-loop shape and the majority of emitter regions are arranged on both sides of the loop. This arrangement ensures that the individual emitter regions, even when the number of the emitter regions is increased to a great extent, can be applied with a uniform control signal, thereby preventing degradation of the turn-off characteristics.

15 Claims, 10 Drawing Figures

SEMICONDUCTOR DEVICES OF MULTI-EMITTER TYPE

This is a continuation of application Ser. No. 295,249, filed Aug. 24, 1981, now abandoned.

BACKGROUND OF THE INVENTION

1. Field of the Invention

This invention relates to an improvement in a semiconductor device, for example a gate-turn-off thyristor having a pair of main electrodes and a control electrode wherein a control signal is applied between one of the paired main electrodes and the control electrode to control conduction between the paired main electrodes.

Especially, the present invention is suitable for obtaining high-power semiconductor devices or in short, power devices adapted to control high power electricity, especially, semiconductor devices adapted to control large current.

2. Description of Prior Art

Semiconductor devices are known which are adapted to control the conduction of large currents by having an arrangement which includes a plurality of emitter regions each surrounded by a control or gate region, or, in short, a semiconductor devices of the multi-emitter type. For example, reference should be made to U.S. Pat. No. 3,611,072 issued to D. R. Hamilton on Oct. 5, 1971. According to the disclosure in this patent, in a gate-turn-off thyristor (hereinafter simply referred to as GTO thyristor) having a disc-shaped semiconductor substrate, cathode regions are surrounded, in a plane of one major surface of the substrate, by a gate region and arranged to extend radially from the center of the disc to the periphery thereof. Each of the cathode regions is in contact with a cathode electrode and the gate region is in contact with a gate electrode. Each cathode electrode is also surrounded, on the plane of the one major surface of the substrate, by the gate electrode. In using the GTO thyristor, all of the cathode electrodes are connected electrically and the entirety is handled as a single cathode electrode.

The arrangement mentioned above is of significance with regard to applications which require turning off large load currents with high efficiency. More specifically, the elongated cathode which is surrounded by the gate electrode is effective to ensure that differences or irregularities in distances between the island of the cathode and the gate can be minimized and, consequently, the turn-off signal from the gate electrode effectively exerts its effect as all of the cathode regions. In addition, a large number of cathode regions cooperate as a whole to enlarge the main current flowing region and hence increase current capacity of the GTO thyristor.

However, in attempting to further increase the current capacity, the prior art faces many difficulties. More particularly, in order to enhance the current capacity with the multi-cathode or generally, multi-emitter arrangement as described so far, such an expedient as increasing the number of those cathode regions or widening the individual separate cathode regions or both of these expedients are required. The excessive enlargement of the area of the individual cathode regions, however, prevents uniform turn-off within the individual cathode regions and therefore this expedient is applicable only within a limited extent. Similar inconveniences are encountered when the length of the cathode region of a strip shape in a plane of one major surface of the substrate is elongated with its width unchanged. Further, the expedient of increasing the number of the cathode regions will require an unduly large space if the cathode regions are radially arranged to be confined within a single concentric zone as in U.S. Pat. No. 3,611,072. Also, in increasing the number of the cathode regions, all of the cathode regions are required to be applied with the turn-off signal with minimal localization or substantially without localization. Therefore, it is necessary to take into account not only the arrangement of the cathode regions but also the geometry of the gate electrode and the manner of applying the turn-off signal to the gate electrode from outside of the device. In U.S. Pat. No. 3,611,072, integral ballast resistors are employed for turn-off uniformity but no advance is found in the arrangement for the gate electrode and cathode regions which is simply a so-called center-gate structure that is well known in the art.

SUMMARY OF THE INVENTION

An object of the present invention is to provide a semiconductor switching device which is suitable for controlling large current.

Specifically, it is an object of the invention to provide an improved semiconductor device of multi-emitter type in which the relation between the gate signal and the individual emitter regions can be highly uniform.

This invention is featured by the provision of a semiconductor substrate having a gate region exposed to one major surface of the semiconductor substrate, and a plurality of emitter regions separated from each other by the gate region, wherein a gate electrode is formed on a portion of the gate region which is exposed to the one major surface. The gate electrode is designed or arranged to have a portion which is applied with an external gate signal. This portion is generally of a continuous line shape or a closed loop shape, preferably of a ring or circle-like shape. The emitter regions are arranged on both sides of the continuous line shape, particularly, on inner and outer sides of the closed loop. With a large number of emitter regions, the closed loop is preferred for saving space.

In a completed semiconductor device in which a member for transmission of the gate signal fed from outside of the semiconductor device is provided on the region which is designed in a closed loop shape, resistance measured along the closed loop is advantageously smaller than resistance measured at the remaining portion of the gate electrode.

DESCRIPTION OF PREFERRED EMBODIMENTS

Referring now to FIGS. 1 through 5, a preferred embodiment of a GTO thyristor according to the invention will be described. In describing the outline of an overall structure, reference should first be made to FIG. 4. The GTO thyristor has packaging means of so-called flat package type. This packaging means comprises a cathode external electrode 3, an anode external electrode 4, the electrodes 3 and 4 being of a post like or disc shape, flanges 61 and 62 airtightly secured to peripheries of the electrodes 3 and 4, respectively, and an insulating sleeve 5 having upper and lower ends to which the flanges 61 and 62 are airtightly secured, respectively. Interposed between the paired external electrodes 3 and 4 are a GTO substrate 1 and a composite cathode and gate electrode plate 2. A gate outlet 270 of a lead or rod shape extends from the plate 2 for connection to a gate pipe 7 which passes through the insulating sleeve 5.

The GTO substrate 1 and composite cathode and gate electrode plate 2 will now be described specifically with reference to FIGS. 1 through 3. The GTO substrate 1 comprises a p-conductivity type emitter (anode) 12, an n-conductivity type base 13, a p-conductivity type base (gate) 14, an n-conductivity type emitter (cathode) 15, a cathode electrode 16 constituting one main electrode in ohmic contact with the n-conductivity type emitter 15, a gate electrode 17 in ohmic contact with an exposed surface of the p-conductivity type base 14 on the same side of an exposed surface of the n-conductivity type emitter 15, and an anode electrode 18 constituting the other main electrode in ohmic contact with the p-conductivity type emitter 12 through a solder layer 19.

The n-conductivity type emitter 15 includes a plurality of n-conductivity type emitter regions which are elongated or of a strip shape in plane geometrical topography and surrounded by the gate electrode. A laminar region of the four layers of pnpn constitutes a main current flowing region and an adjacent laminar region of the three layers of pnp constitutes a controlling region.

The n-conductivity type emitter region 15 takes the form of an oblong of an about 0.2 mm width and an about 5 mm length and projects from the surface of the adjoining p-conductivity type base 14 by about 30 $\mu$m to form a mesa shape. The cathode electrode 16 is an Al vapor-deposited film of an about 10 $\mu$m thickness which is in ohmic contact with the surface of the mesa. The n-conductivity type emitter regions 15 each having the above configuration and construction are more than 150 in total number and arranged radially on the surface of the disc substrate 1 to be confined within double concentric zones.

Such n-conductivity type emitter regions 15 are surrounded by the gate electrode 17 being an Al vapor-deposited film of an about 10 $\mu$m thickness which is in ohmic contact with a portion, exposed to the substrate surface, of the p-conductivity type base 14. The p-conductivity type base 14 partly projects to form a mesa shape 140 which is flush with the n-conductivity type emitter region, and the gate electrode 17 is in continuation to the surface of the mesa 140 of the p-conductivity type base 14. A closed-loop or circle-shape gate electrode plate or gate ring 27 is pressed on a circle-shape portion 170 of the gate electrode 17 to make contact thereto.

Figure 1:
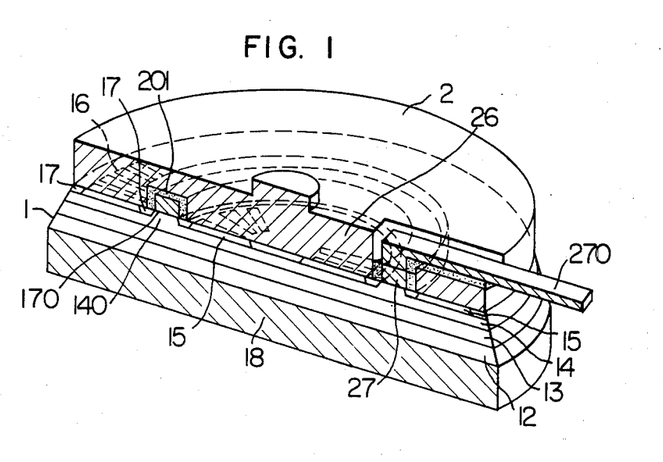
FIG. 1 is a perspective view, in sectional form, of a GTO thyristor embodying the invention.
Figure 2:
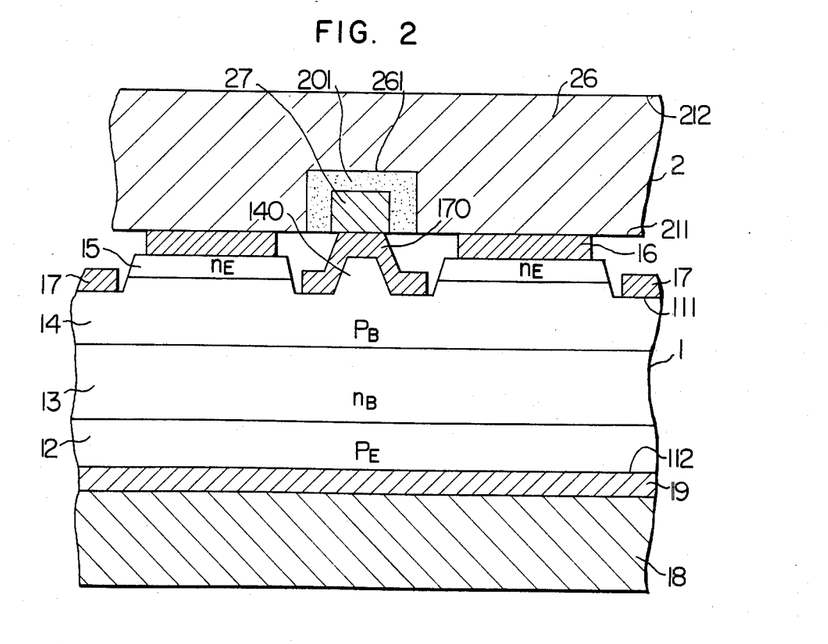
FIG. 2 is a fragmentary, enlarged sectional view of the FIG. 1 GTO thyristor.
Figure 3:
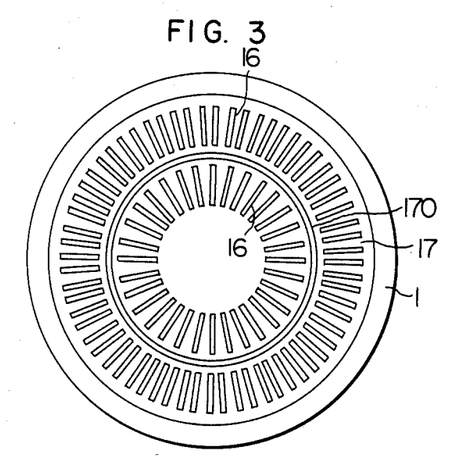
FIG. 3 is a plan view showing a top surface of a substrate formed with cathode regions which is incorporated in the FIG. 1 GTO thyristor.
Figure 4:
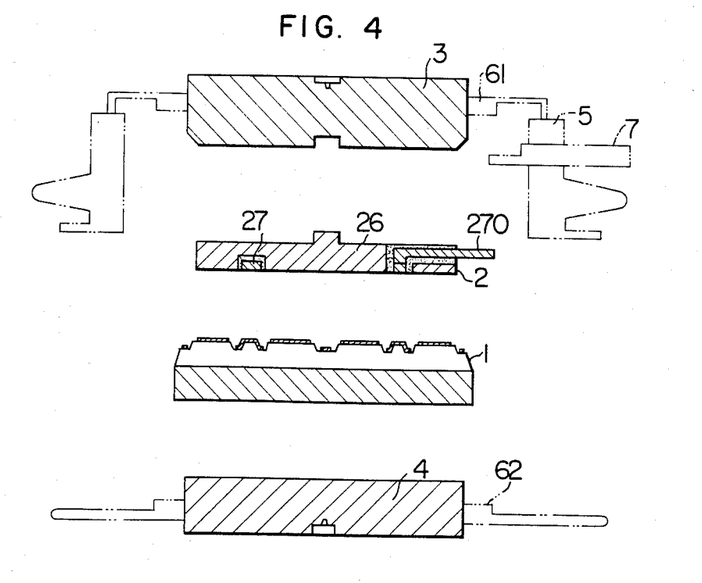
FIG. 4 is an exploded sectional view useful in explaining the assemblage of components of the FIG. 1 GTO thyristor.

As shown in FIGS. 1 and 3, the mesa 140 of the p-conductivity type base extends in a circle or ring configuration between concentric zones of the double concentric arrangement of the radial n-conductivity type emitter regions 15, and all of the n-conductivity type emitter regions 15 are substantially equi-distant from the gate ring 27.

Since the surface of the mesa 140 is substantially flush with the surface of the n-conductivity type emitter, the composite electrode plate 2, having incorporated therein the gate ring 27 and the cathode electrode plate 26, and the semiconductor substrate 1, when they are pressed against each other, are brought into contact with each other through the n-conductivity type emitter and the mesa 140. In general, the semiconductor substrate for use in large-current control semiconductor devices as intended by the present invention is of a disc shape so that it is preferable that the gate electrode plate 27 also takes the form of a ring shape.

Semiconductor layers in the semiconductor substrate 1 were prepared through the following process. An n-conductivity type silicon (Si) wafer was first prepared, and p-conductivity type impurity, for example, boron was doped in opposite major surfaces of the Si wafer by diffusion to form the p-conductivity type emitter 12 and the p-conductivity type base 14. Then, n-conductivity type impurity, for example, phosphorous was doped in the exposed major surface of the p-conductivity type base 14 in a predetermined pattern by diffusion to form the n-conductivity type emitter 15. Thereafter, the n-conductivity type emitter 15 and a portion of the p-conductivity type base 14 corresponding to the mesa 140 were covered with a mask, and the remaining uncovered portion was etched by an etchant, thereby obtaining an uneven major surface 111. The above process is simply for exemplification and other methods may of course be employed for the same purpose.

The composite electrode plate 2 will now be described. The cathode electrode disc 26 is a molybdenum (Mo) disc of an about 3 mm thickness. One major surface 211 of this disc is cut to form a ring-shape groove 261, in which the gate ring 27 of molybdenum is accommodated. The gate ring 27 is insulated from the cathode electrode disc 26 by an insulator 201 of glass, for example, and held in place thereby. The exposed surface of the gate electrode plate 27 is flush with the one major surface 211 of the disc 26.

The gate ring 27 has a width of about 1 mm and a thickness of about 1 mm and its electrical resistance as measured along its ring path is very small, amounting to 0.001 $\Omega$ or less. As shown in FIG. 1, the gate ring 27 is in contact with a gate lead 270 through a low resistance in order to set up an electrical connection with an external gate terminal for delivery of gate signals. The gate lead 270 comes into contact with the gate ring 27 at one point in the illustrated embodiment but the contact may be done at a plurality of points, as desired. In actual practice, contact at a plurality of points is rather preferable for reduction of the gate resistance.

Figure 5:
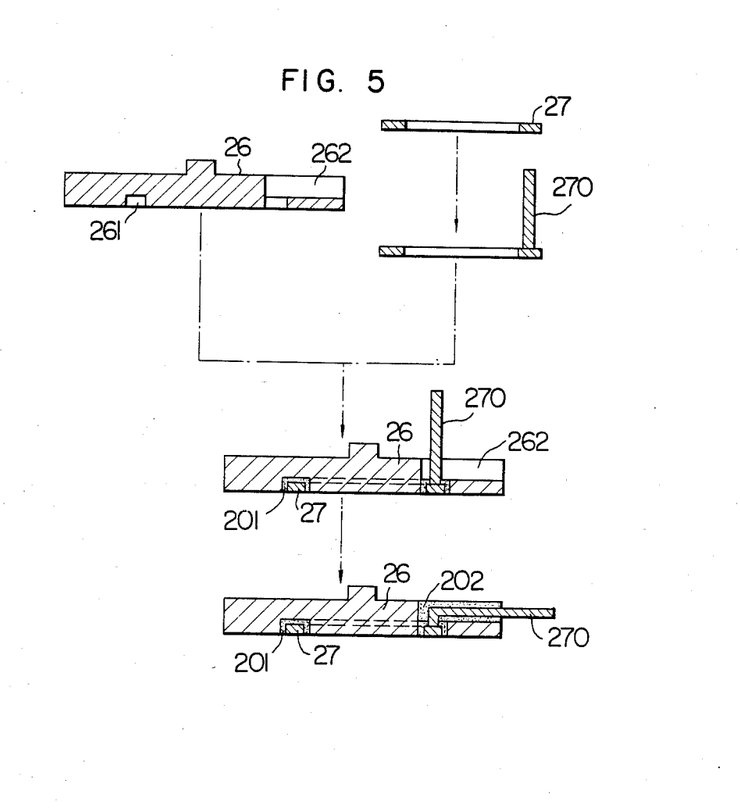
FIG. 5 is an exploded sectional view useful in explaining the assemblage of a composite cathode and gate electrode plate which is one of components shown in FIG. 4.

The composite electrode plate in the foregoing embodiment was prepared through process as shown in FIG. 5. A Mo disc 26 of a thickness of about 3 mm was cut to form the ring-shape groove 261 having a width of 1.2 mm and a depth of about 1.2 mm. A recess 262 was formed in the other major surface of the disc 26 as designated by 212 in FIG. 2. This recess 262 connects peripheries of the groove 261 and the disc 26. The Mo gate electrode plate 27 was formed to have a thickness of about 1.0 mm and a width of about 1.0 mm, and the gate lead 270 of Mo having the same thickness and width as those of the gate electrode plate 27 was welded to a surface site of the plate 27. Subsequently, the Mo disc 26 and the Mo gate ring 27 with the Mo gate lead 270 are put together and glass powder 201 was filled in. The resulting assembly was heat treated to sinter the glass powder, thus bonding the disc 26 and the gate electrode plate 27 together through the insulator.

The glass material used in this process is of course preferred to have a thermal expansion coefficient which approximates that of Mo. After glass bonding, the Mo gate lead 270 was bent into the recess 262 provided beforehand in the Mo disc 26 and then sealed with glass 202. Thereafter, at least the lower surface, as viewed in FIG. 5, of the resulting assembly of the Mo disc and plate was polished by lapping to improve its flatness or if necessary, the parallelism of the upper and lower surfaces.

The ring-shape gate electrode plate 27 of the composite electrode plate 2 is put into contact with the closed-loop or circle-shape portion 170 of the gate electrode 17 as shown in FIG. 3 illustrating a plan view of the GTO substrate 1 as viewed from the major surface including the cathode electrode. Respective cathode electrode regions 16 are arranged radially on inner and outer sides of the circle-shape portion 170 and equidistant therefrom and are spaced equi-distantly from each other.

In order to turn on the GTO thyristor in a forward blocking state in which a given power source and lead are connected between the cathode and anode electrodes, a predetermined voltage is applied between the cathode and gate electrodes, having negative polarity at the cathode electrode. To turn off the GTO thyristor, a predetermined voltage having positive polarity at the cathode electrode is applied between these electrodes. The foregoing embodiment is advantageous in applying the turn-on or turn-off voltage to the individual cathode regions with low loss and uniformity because the external gate lead is coupled with the circle-shape portion 170 of the gate electrode 17 by way of the ring shape gate electrode plate 27 and the individual cathode regions are spaced from the portion 170 at small equi-distances. For example, when the entire gate current drawn through the gate electrode is 300 to 500 A during turn-off operation, it is possible to hold down the difference in voltage drops between each cathode region and the gate lead to 10 mV or less at the most. Accordingly, it is possible to prevent a disadvantage found in the conventional GTO thyristor that delayed turn-off occurs in certain cathode regions during the turn-off operation causing the main current to concentrate in those cathode regions. For these reasons, the GTO thyristor according to teachings of the invention advantageously improves the interruptible current, especially, the non-repetitive maximum interruptible current taking place in an abnormal operation in which a surge voltage or a surge current is applied.

To detail the advantage of the invention in comparison with the prior art example, it is assumed that in the double concentric arrangement of the radial cathode regions as in the foregoing embodiment of the invention, the external gate lead is connected with the gate electrode only at the center of the arrangement as in the conventional center gate type.

In this assumption, due to the fact that the gate electrode which is usually formed by vapor deposition in a thin thickness of about 5 to 10 $\mu$m has a resistance which increases along the major surface of the substrate, a voltage drop occurs in the gate electrode in the direction of current flow through the gate electrode along the major surface of the substrate when the turn-off signal which is negative relative to the cathode electrode is applied to the gate lead.

Because of this voltage drop, potential distribution in the gate electrode is such that relative to the cathode electrode, the potential difference is large near the gate lead but small in the far distance. Consequently, the conventional GTO thyristor entails a disadvantage that the turn-off signal is intensive in a main current flowing region near the gate lead and weak in a main current flowing region remote from the gate lead, resulting in irregular turn-off operations in the respective regions.

The uneven turn-off operations cause the load current to concentrate in the delayed turn-off region during the turn-off operation of the GTO thyristor. As a result, the maximum load current allowable for the GTO thyristor to turn-off without breakdown (maximum interruptible current) is decreased as compared with the situation when the turn-off operations are uniform in the individual main current flowing regions.

In effect, it has proven that currents of about 800 A which can be expected to be interrupted in uniform gate operation will be decreased to about 400 A due to uneven gate operation. In contrast, the foregoing embodiment, though having a similar arrangement of the cathode regions to that of the prior art device, completely eliminated the disadvantages set forth hereinbefore.

Figure 6:
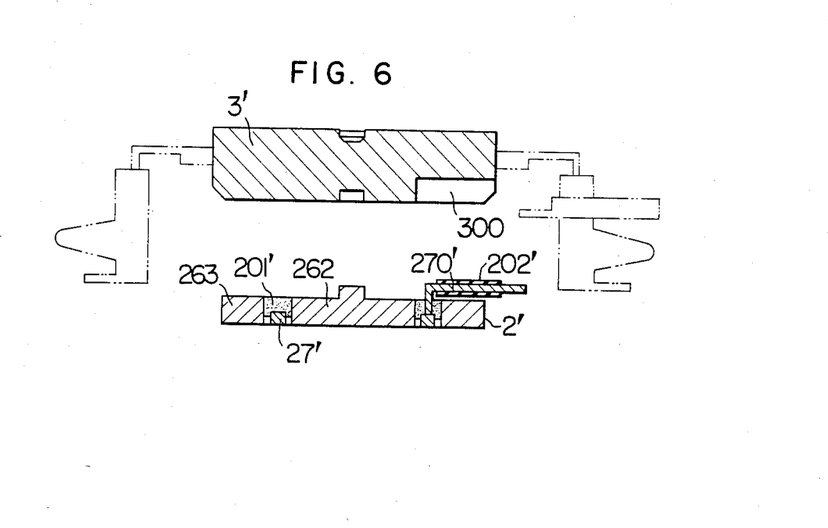
FIG. 6 is a sectional view showing a modified embodiment of the composite cathode and gate electrode plate used in the FIG. 1 GTO thyristor.
Figure 7:
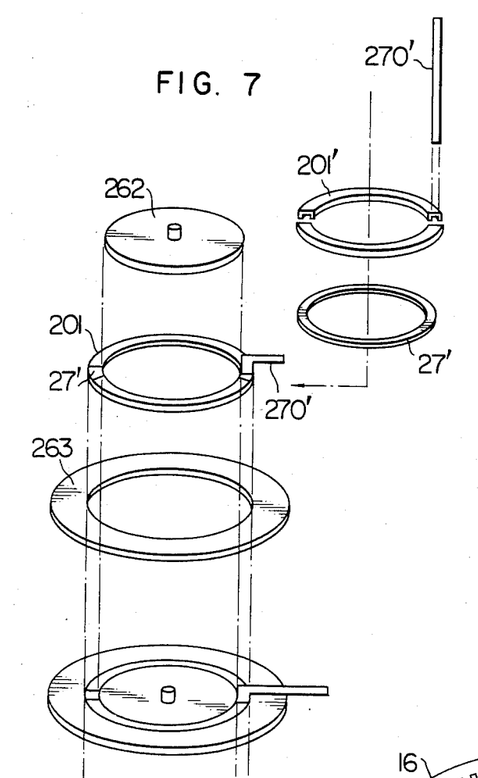
FIG. 7 is an exploded perspective view useful in explaining the assemblage of the composite cathode and gate electrode plate shown in FIG. 6.

Referring now to FIGS. 6 and 7, a modified composite gate and cathode electrode plate applicable to the foregoing embodiment will be described. As shown in FIG. 6, a composite electrode plate 2' has a cathode electrode plate consisting of two members, that is, an inner disc 262 and an outer ring 263 of a flat ring shape. Interposed between the inner disc 262 and outer ring 263 is a composite structure of an insulating ring 201' and a gate ring 27'. The inner disc 262 and outer ring 263 each have a thickness of about 1.0 mm. The gate ring 27' has a width of about 1.0 mm and a thickness of about 0.5 mm and its resistance along one circumference of its own is very small, amounting to about 0.01 $\Omega$ or less. The insulating ring 201' is made of ceramic and has a width of about 2.0 mm and a thickness of about 0.5 mm. The width of the insulating ring 201' is substantially equal to or slightly less than the gap between the inner disc 262 and outer ring 263. A gate lead 270' extends from a portion of the gate ring 27' to above the insulating ring 201' and is bent to continue toward the periphery of the composite electrode plate 2'. Since in the FIG. 6 modification the gate lead 270' lies above the composite electrode plate 2', that is, above its upper major surface, an external cathode electrode 3' to be mated with the composite electrode plate 2' is partly cut to form a recess 300 in which the gate lead 270' is accommodated when the plate 2' and electrode 3' are closely put together. An insulator cover 202' applied on the gate lead 270' ensures electrical insulation between the gate lead 270' and electrode 3' in the event of mutual contact. The remaining components of the package are essentially the same as those of FIG. 4 and are not illustrated in FIG. 6.

FIG. 7 shows assemblage of the composite electrode plate 2' of FIG. 6. The insulating ring 201' was first formed by two semicircular alumina ($Al_2O_3$) members each having a thickness of about 0.8 mm and a width of about 2.0 mm. Formed in one surface (lower surface in the drawing) of the member was a circumferential groove of an about 1.0 mm width and an about 0.3 mm depth. The gate ring 27' of silver (Ag) or Kovar (an alloy containing iron, nickel and cobalt) with surface treatment of silver plating was bonded to the groove of the insulating ring 201' by using solder containing silver. Concurrently, the gate lead 270' of silver or copper having a diameter of about 2.0 mm was welded to a portion of the gate ring 27'. A thus prepared composite structure of insulating ring 201', gate ring 27' and gate lead 270' was placed between the inner disc 262 and the outer ring 263 that were prepared beforehand, thus completing the composite electrode plate 2'.

Figure 8:
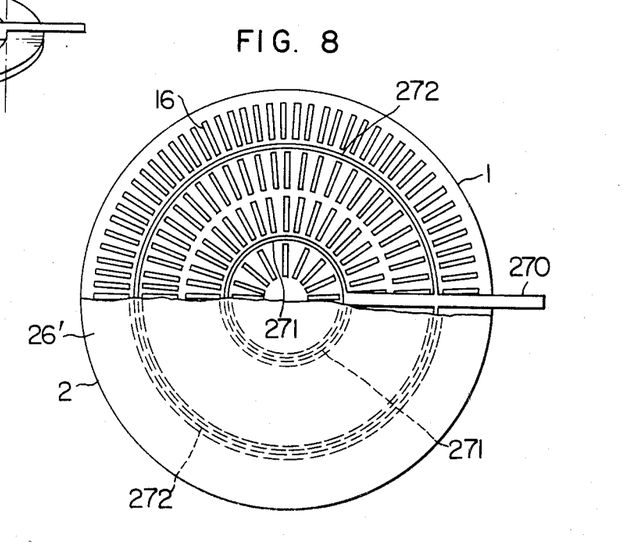
FIG. 8 is a plan view showing another embodiment of a GTO thyristor according to the invention with its composite cathode and gate electrode plate partly removed.
Figure 9:
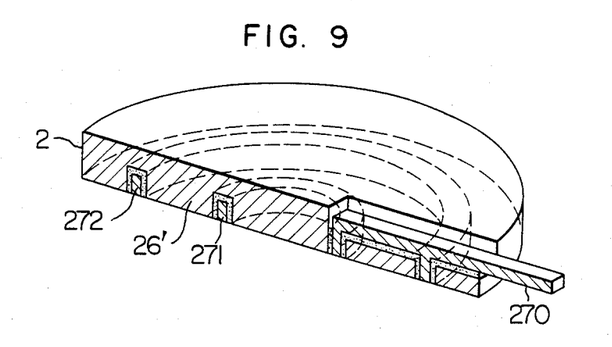
FIG. 9 is a perspective view, in sectional form, of a composite cathode and gate electrode plate applicable to the FIG. 8 embodiment.
Figure 10:
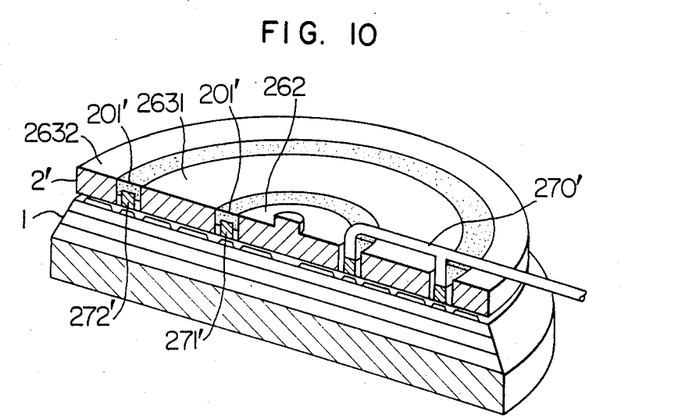
FIG. 10 is a perspective view, in sectional form, of a modified composite cathode and gate electrode plate mounted on a semiconductor substrate.

Another embodiment of GTO thyristor according to the invention as shown in FIGS. 8 through 10 is suitable for large capacity semiconductor devices. In FIG. 8, a semiconductor substrate 1 has one hundred n-conductivity type emitter regions 16 in total which are radially arranged to be confined within quadruple concentric zones, and a composite gate and cathode electrode plate 2 is carried on the semiconductor substrate 1. For clarity of the arrangement of n-conductivity type emitter regions 16 on the substrate surface, the plate 2 is shown as partly removed in FIG. 8. A first gate ring 271 lies between the inner first and second concentric zones of the quadruple concentric zone of the arrangement of the radial n-conductivity type emitter regions 16. A second gate ring 272 lies between the third and fourth concentric zones. The first and second gate rings 271 and 272 are electrically connected by a gate lead 270. The gate lead 270 extends exteriorly of the composite electrode plate 2.

FIG. 9 shows, in sectional form, the composite electrode plate 2. This construction is essentially the same as the composite electrode plate 2 of FIG. 1 with the only exception being that the number of the gate rings is different (one in FIG. 1 and two in FIG. 9). The same fabrication process as explained with reference to FIG. 5 can be applied to this modification.

FIG. 10 shows a modified composite gate and cathode electrode plate 2' applicable to the semiconductor substrate 1 a shown in FIG. 8. This composite electrode plate 2' of FIG. 10 is essentially the same as the FIG. 6 composite electrode plate 2' with the only exception being that the number of the gate rings is different (one in FIG. 6 and two in FIG. 10). It will be appreciated that the FIG. 10 composite electrode plate 2' has two gate rings so that the outer ring 263 in FIG. 6 is divided into a first outer ring 2631 and a second outer ring 2632 in FIG. 10. For fabrication of the FIG. 10 composite electrode plate 2', the process as explained with reference to FIG. 7 can be applicable.

According to the invention, impairment of turn-off performance can be avoided even in the large capacity GTO thyristor or semiconductor switching device using several hundreds n-conductivity type emitter regions or more.

The composite gate and cathode electrode plate as employed in the foregoing embodiments has many specific advantages as set forth below. First, the construction of the gate electrode and the cathode electrode can be simplified. Second, packaging can also be facilitated. Third, the projecting mesa 140 of the p-conductivity type base 14 is provided and designed to have the same height as that of the n-conductivity type emitter, so that when flat packaging is employed and the semiconductor substrate 1 is brought into electrical contact with the paired external electrodes 3 and 4 by pressing the mesa 140 shares an unduly excessive pressure which would be applied to the n-conductivity type emitter, thereby making it possible to prevent deformation or fracture of the cathode electrode 16 formed on the surface of the emitter. In the past, it was frequent that the cathode electrode 16 of this type of flat packaging devices was pressed due to the above pressing pressure (about 1000 $Kg/cm^2$ or more) and heated due to heat generation in the semiconductor substrate 1 during operation of the devices (about 150° C.) and thus undergoes a phenomenon called "creep" in metallography, resulting in deformation of the cathode electrodes. The foregoing embodiments of the invention can advantageously prevent such deformation.

The invention has been described using specified embodiments which should be taken for illustration purposes only. For example, metal material for the gate ring and cathode electrode exemplified as Mo may be replaced by any other high conductive material of a thermal expansion coefficient approximate to that of the semiconductor substrate, for example tungsten (W) or a composite material which has carbon fibers embedded in a Cu matrix. Also, material for insulating interposed between the gate ring and the cathode electrode plate is not limited to glass but may be replaced by polyimide film or ceramics. Especially, machinable ceramics are suitable for the insulating ring 201' in the composite electrode plate 2' shown in FIG. 6 or 10. For example, machinable glass ceramics "Macor" (trade mark) may be available.

Further, it is not always necessary to incorporate the cathode electrode plate and the gate ring in the composite electrode plate but instead these members may be separated. In this case, they may be assembled with an interposition of an insulator between them or may be spaced apart at a predetermined distance. The circular shape of the gate ring is suitably adapted for the semiconductor substrate disc but the configuration of the gate ring may take various forms. The gate ring and the gate electrode may be formed by different members or may otherwise be made of substantially the same member. For example, when the projecting portion 170 of the gate electrode 17 is designed to be thicker than the remainder of the gate electrode 17, the gate ring 27 may then be omitted. In this case, the portion 170 substantially acts as the gate ring.

Moreover, it is not always necessary that the projecting portion of the gate electrode and the cathode electrode be coplanar. In this case, however, levels of the gate ring and the cathode electrode plate in the composite electrode plate are required to be so adjusted as to make intimate contact to predetermined portions of the semiconductor substrate.

While in the foregoing embodiments the invention has been described by way of thyristors, it should be understood that the invention is also applicable to semiconductor devices using fine patterns such as power transistors, static induction or field effect thyristors and reverse blocking thyristors.

We claim:

1. A semiconductor device comprising:
   a semiconductor substrate having a pair of opposite major surfaces which substrate comprises between said major surfaces a plurality of first semiconductor regions of one conductivity type exposed to one major surface of the substrate, and a second semiconductor region of another conductivity type opposite to said one conductivity type adjacent to said first semiconductor regions and exposed to said one major surface so that said first semiconductor regions are individually separated and surrounded by said second semiconductor region in said one major surface,
   a plurality of first electrodes disposed directly on said first semiconductor regions respectively,
   a second electrode disposed directly on said second semiconductor region,
   a first conductive member which electrically connects said first electrodes together,
   electrical connection means having at least one closed loop shaped portion which is discrete from said second electrode for providing electric connection of low resistance to a selected closed loop shaped area of said second electrode which area corresponds to the closed loop shape of said electrical connection means,
   said first semiconductor regions being arranged along and on the inner and outer sides of said closed loop shaped portion of said electrical connection means, and
   a second conductive member connected electrically to said electrical connection means.

2. A semiconductor device as claimed in claim 1, wherein said closed loop shapes of said portion of said electrical connection means and said selected area of said second electrode are substantially circle shapes, and said first semiconductor regions each individually have a strip shape and are respectively arranged in a radial manner on the inner and the outer side of the circle shaped portion of the electrical connection means.

3. A semiconductor device as claimed in claim 1, wherein said closed loop shapes of said portion of said electrical connection means and said selected area of said second electrode include a plurality of substantially concentric circles, and said first semiconductor regions each individually have a strip shape and are respectively arranged in a radial manner on an inner and an outer side of each of said circle shaped portion of the electrical connection means.

4. A semiconductor device as claimed in claim 1, wherein said electrical connection means includes a metal member having a closed loop line shape disposed directly on said second electrode.

5. A semiconductor device of a gate-turn-off type comprising:
   a semiconductor substrate having a pair of opposite major surfaces which substrate includes between said major surfaces a plurality of first emitter regions of one conductivity type exposed to one major surface, a first base region of another conductivity type opposite to said one conductivity type adjacent to said first emitter regions and exposed to said one major surface so that said first emitter regions are individually separated and surrounded by said first base region in said one major surface, a second base region of said one conductivity type adjacent to said first base region, and a second emitter region of said another conductivity type adjacent to said second base region and exposed to the other major surface of the substrate,
   a plurality of first main electrodes disposed directly on said first emitter regions on said one major surface respectively,
   a second main electrode disposed directly on said second emitter region on said other major surface,
   a gate electrode disposed directly on said first base region on said one major surface,
   a composite structure comprising a substantially plate shaped conductor member to be disposed on and electrically connected to said first main electrodes, a ring shaped conductor member to be disposed on and electrically connected to a selected ring shaped area of said second electrode surface, and an insulation member insulating said ring shaped conductor member from said plate shaped conductor member and positioning said ring shaped conductor with respect to said plate shaped conductor member,
   said first emitter regions being disposed radially along the inside and the outside of said ring shaped conductor member, and
   a pair of main external electrodes disposed on said plate shaped conductor member and said second main electrode, respectively.

6. A semiconductor device as claimed in claim 5, wherein said one major surface of the semiconductor substrate is an uneven surface, which has mesa shaped portions at said first emitter regions and at a portion of said first base region onto which said ring shape conductor member is disposed.

7. A semiconductor device as claimed in claim 6, wherein top surfaces of said mesa shaped portions of said first emitter regions and said portion of said first base region are arranged to be in a plane with one another.

8. A semiconductor device as claimed in claim 5, wherein said plate shaped conductor member has at least one groove of a ring shape in a surface which is to be disposed on said first main electrodes and wherein said ring shaped conductor member is embedded in said groove.

9. A semiconductor device as claimed in claim 5, wherein said plate shaped conductor member comprises a disc shaped member and at least one flat ring shaped member having an inner diameter larger than a diameter of said disc shaped member, and wherein said ring shaped conductor member is located between said disc shaped member and said flat ring shaped member.

10. A semiconductor device as claimed in claim 1, wherein said electrical connection means is mechanically integrated with said first conductive member through insulating material.

11. A semiconductor device as claimed in claim 1, wherein said first conductive member and said electrical connection means are in pressure contact with said first electrodes and the selected area of said second electrode, respectively.

12. A semiconductor device as claimed in claim 5, wherein said composite structure is pressure contacted to said semiconductor substrate.

13. A gate-turn-off thyristor of a flat package type including a four-layer semiconductor substrate and a pair of flat external electrode structures sandwiching said semiconductor substrate and pressurized thereonto, comprising:

one of said pair of flat external electrode structures including a conductor plate having a looped groove and a conductor loop accommodated in said looped groove through an insulating material; and said semiconductor substrate having a surface including a plurality of emitter areas of one conductivity type surrounded by a base area of another conductivity type opposite to said one conductivity type, the base area including a loop portion in register with said conductor loop of said conductor plate, the emitter regions being located at equidistance positions from said looped portion of said base area on both sides of said looped portion of said base area;

emitter electrodes formed on said emitter areas and being in pressurized contact with said conductor plate; and a base electrode formed on said base area, surrounding the respective emitter electrodes and including a contact portion on said looped portion in pressurized contact with said conductor loop.

14. A semiconductor device as claimed in claim 13, wherein a surface of the conductor loop which is in pressurized contact with said contact portion of said base electrode is coplanar with a surface of said conductor plate which is in pressurized contact with said emitter electrodes, and wherein said contact portion of said base electrode is coplanar with said emitter electrodes.

15. A semiconductor device as claimed in claim 14, wherein said base area has a recessed portion at least around each emitter area.

* * * * *